US006829682B2

(12) United States Patent
Kirihata et al.

(10) Patent No.: US 6,829,682 B2
(45) Date of Patent: Dec. 7, 2004

(54) DESTRUCTIVE READ ARCHITECTURE FOR DYNAMIC RANDOM ACCESS MEMORIES

(75) Inventors: Toshiaki Kirihata, Poughkeepsie, NY (US); Sang Hoo Dhong, Austin, TX (US); Hwa-Joon Oh, Austin, TX (US); Matthew Wordeman, Makawao, HI (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/843,504

(22) Filed: Apr. 26, 2001

(65) Prior Publication Data

US 2002/0161967 A1 Oct. 31, 2002

(51) Int. Cl.[7] .............................................. G06F 12/00
(52) U.S. Cl. .................... 711/143; 711/141; 711/142; 711/144; 711/133; 711/134; 711/105
(58) Field of Search ................................ 365/203, 205, 365/207, 208, 233, 222, 230.03; 711/105, 113, 133, 134, 142, 143, 144

(56) References Cited

U.S. PATENT DOCUMENTS

| | | | | |
|---|---|---|---|---|
| 5,691,934 A | * | 11/1997 | Douglass | 365/149 |
| 5,691,935 A | * | 11/1997 | Douglass | 365/149 |
| 5,784,705 A | | 7/1998 | Leung | 711/169 |
| 5,926,839 A | | 7/1999 | Katayama | 711/169 |
| 5,949,732 A | | 9/1999 | Kirihata | 365/230.03 |
| 5,991,851 A | | 11/1999 | Alwais et al. | 711/106 |
| 6,005,824 A | * | 12/1999 | Crafts | 365/233 |
| 6,047,359 A | * | 4/2000 | Fouts | 711/137 |
| 6,078,547 A | | 6/2000 | Leung | 365/233 |
| 6,085,300 A | | 7/2000 | Sunaga et al. | 711/168 |
| 6,115,791 A | * | 9/2000 | Collins et al. | 711/122 |
| 6,178,479 B1 | * | 1/2001 | Vishin | 711/106 |
| 6,188,615 B1 | * | 2/2001 | Perner et al. | 365/189.01 |
| 6,188,627 B1 | | 2/2001 | Blackmon et al. | 365/222 |
| 6,191,988 B1 | * | 2/2001 | DeBrosse | 365/205 |
| 6,311,280 B1 | * | 10/2001 | Vishin | 713/320 |
| 6,389,505 B1 | * | 5/2002 | Emma et al. | 711/106 |
| 6,449,202 B1 | * | 9/2002 | Akatsu et al. | 365/205 |

OTHER PUBLICATIONS

Toshiaki Kirihata, Yohji Watanabe, Hing Wong, John K. DeBrosse, Munehiro Yoshida ,Daisuke Kato, Shuso Fujii, Matthew R. Wordeman, Peter Poechmueller, Stephen A. Parke and Yoshiaki Asao, "*Fault—Tolerant Designes for 256 Mb DRAM*", IEEE Journal of Solid State Circuits, vol. 31, pp. 558–566, Apr. 4, 1996.

Takeshi Nagai, Kenji Numata, Masaki Ogihara, Mitsuru Simizu, Kimimasa Imai, Takahiko Hara, Munehiro Yoshida, Yoshikazu Saito, Yoshiaki Asao, Shizuo Sawada and Syuso Fujii, "*A 17–ns 4–Mb CMOS DRAM*", IEEE Journal of Solid–State Circuits, vol. 26, pp. 1538–1543, Nov. 11, 1991.

* cited by examiner

*Primary Examiner*—T Nguyen
(74) *Attorney, Agent, or Firm*—Robert A. Walsh; Cantor Colburn LLP

(57) ABSTRACT

A method for controlling the operation of a dynamic random access memory (DRAM) system, the DRAM system having a plurality of memory cells organized into rows and columns, is disclosed. In an exemplary embodiment of the invention, the method includes enabling a destructive read mode, the destructive read mode for destructively reading a bit of information stored within an addressed DRAM memory cell. The destructively read bit of information is temporarily stored into a temporary storage device. A delayed write back mode is enabled, the delayed write back mode for restoring the bit of information back to the addressed DRAM memory cell at a later time. The execution of the delayed write back mode is then scheduled, depending upon the availability of space within the temporary storage device.

44 Claims, 8 Drawing Sheets

DESTRUCTIVE READ ARCHITECTURE FOR DYNAMIC RANDOM ACCESS MEMORIES

BACKGROUND

The present invention relates generally to integrated circuit memory devices and, more particularly, to improving access cycle time for Dynamic Random Access Memories (DRAMs).

The evolution of sub-micron CMOS technology has resulted in significant improvement in microprocessor speeds. Quadrupling roughly every three years, microprocessor speeds have now even exceeded 1 Ghz. Along with these advances in microprocessor technology have come more advanced software and multimedia applications, requiring larger memories for the application thereof. Accordingly, there is an increasing demand for larger Dynamic Random Access Memories (DRAMs) with higher density and performance.

DRAM architectures have evolved over the years, being driven by system requirements that necessitate larger memory capacity. However, the speed of a DRAM, characterized by its random access time (tRAC) and its random access cycle time (tRC), has not improved in a similar fashion. As a result, there is a widening speed gap between the DRAMs and the CPU, since the clock speed of the CPU steadily improves over time.

The random access cycle time (tRC) of a DRAM array is generally determined by the array time constant, which represents the amount of time to complete all of the random access operations. Such operations include: wordline activation, signal development on the bitlines, bitline sensing, signal write back, wordline deactivation and bitline precharging. Because these operations are performed sequentially in a conventional DRAM architecture, increasing the transfer speed, or bandwidth, of the DRAM becomes problematic.

BRIEF SUMMARY

The above discussed and other drawbacks and deficiencies of the prior art are overcome or alleviated by a method for controlling the operation of a dynamic random access memory (DRAM) system, the DRAM system having a plurality of memory cells organized into rows and columns. In an exemplary embodiment of the invention, the method includes enabling a destructive read mode, the destructive read mode for destructively reading a bit of information stored within an addressed DRAM memory cell. The destructively read bit of information is temporarily stored into a temporary storage device. A delayed write back mode is enabled, the delayed write back mode for restoring the bit of information back to the addressed DRAM memory cell at a later time. The execution of the delayed write back mode is then scheduled, depending upon the availability of space within the temporary storage device.

In a preferred embodiment, enabling a destructive read mode includes developing a differential signal on a pair of precharged complementary bit lines, one of the bit lines being coupled to the addressed DRAM memory cell. The differential signal is then transferred the pair of bit lines to a pair of sense lines, with the sense lines being isolated from the bit lines immediately thereafter. Then, the pair of bit lines is precharged.

BRIEF DESCRIPTION OF THE DRAWINGS

Referring to the exemplary drawings wherein like elements are numbered alike in the several Figures.

DETAILED DESCRIPTION

Figure 1A:
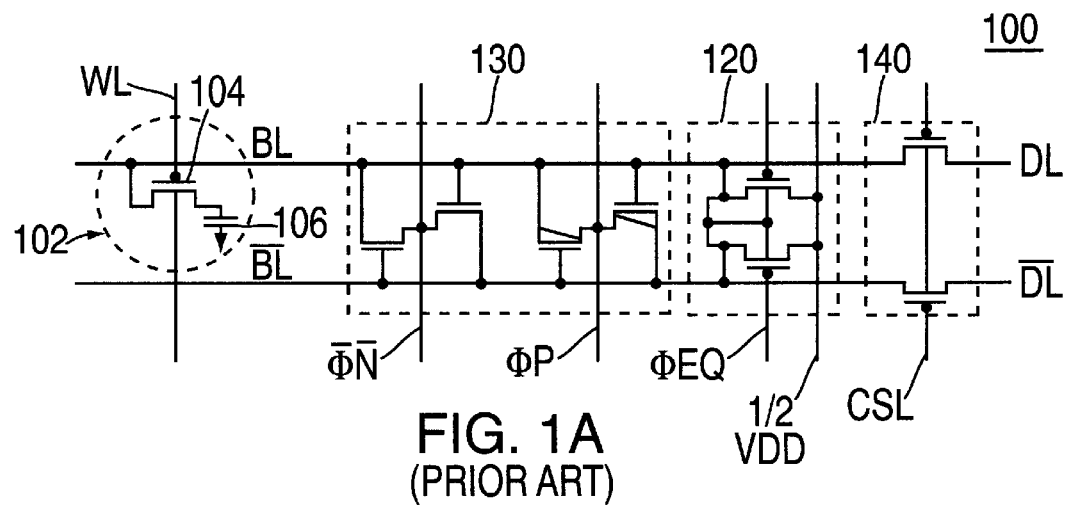
FIG. 1 is a schematic and associated timing diagram of an existing single DRAM structure, illustrating the sequential processing steps associated therewith.
Figure 1B:
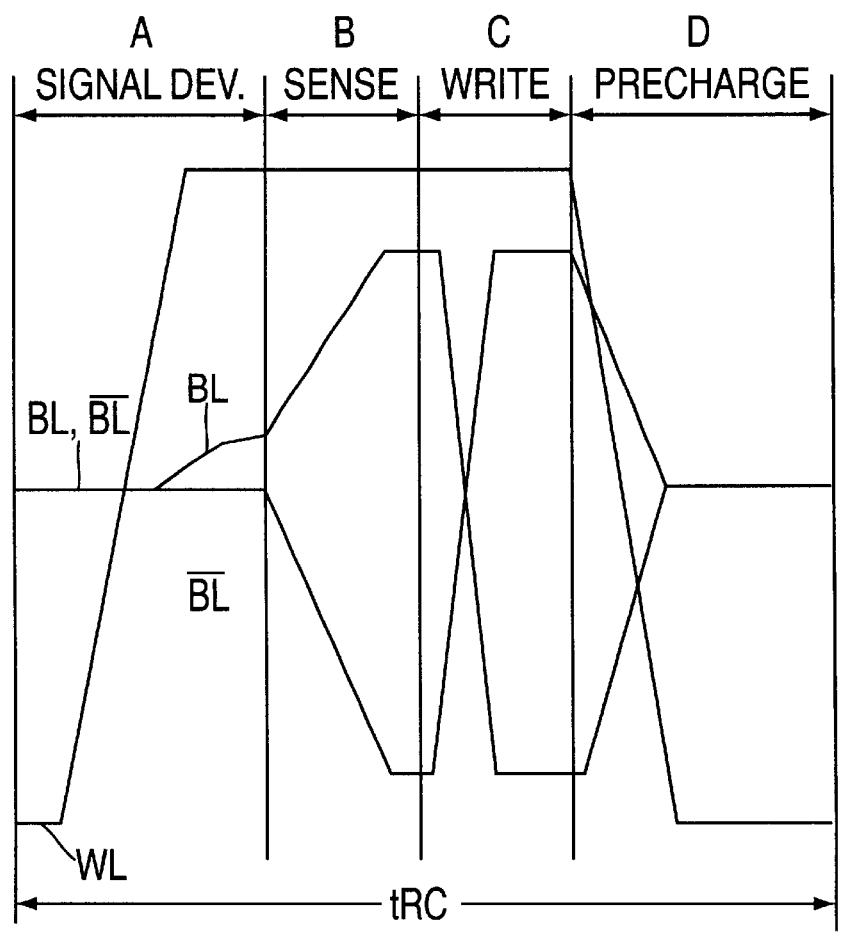

Referring initially to FIG. 1, a conventional DRAM array architecture is shown employing a CMOS cross-coupled sense amplifier (SA). The DRAM array 100 includes a plurality of DRAM cells 102 arranged in a matrix pattern. Each DRAM cell 102 comprises one field effect transistor (FET) 104 and one capacitor 106, functioning as a data bit storage element. The operation of the conventional array 100 is best understood with an explanation of the following sequential signal processing steps:

(A) signal development on the bitlines (BL and BL bar);
(B) bitline (BL) sensing;
(C) signal write back; and
(D) a bitline (BL) precharging operation.

(A) signal development on the bitlines (BL and BL bar): The gate of the FET 104 is coupled to a wordline (WL). As long as WL is low, the capacitor 106 holds a data bit as a charge. The capacitor 106 holds 0 volts for a "data 0" bit, and a predetermined voltage ($V_{DD}$) for a "data 1" bit, respectively. The bitline pairs (BL and BL bar) are already precharged at a ½ $V_{DD}$ level by bitline equalizing devices 120 (when $\Phi_{EQ}$=high). The precharging operation is described in step (D). When WL goes high, the capacitor 106 is coupled to the corresponding bitline (BL) through FET 104. However, prior to the wordline (WL) activation, the bitline (BL) equalizing devices 120 are turned off (when $\Phi_{EQ}$=low). Thus, it is possible to change the bitline voltage by transferring whatever charge is stored in capacitor 106.

(B) bitline (BL) sensing: The CMOS cross-coupled sense amplifier (SA) 130 amplifies the differential voltage between BL and BL bar by driving clock signals $\Phi_N$ and $\Phi_P$ low and high, respectively. The operation of the CMOS cross-coupled sense amplifier is well known in the art, and is not discussed further detail hereinafter.

(C) signal write back: After the BL signal is sufficiently amplified, a column select line (CSL) activates column switch devices 140. This couples the BL pair to the $V_{DD}$ precharged data line pair (DL and DL bar). During a data read mode, a differential voltage is therefore generated on the DL pair, which differential voltage is then sensed by a second sense amplifier (not shown). During a write mode operation, the BL pair may be "flipped", depending upon the data pattern driven from the DL pair. It should be pointed out that a write mode should not be enabled prior to the BL sensing operation, since the BL swing in a write mode (WRITE) causes a coupling noise on an adjacent BL (READ) during signal development, thereby destroying the sensing signal. The bitline voltages are then stored on capacitor 106 through FET 104.

(D) a bitline (BL) precharging operation: Finally, the wordline (WL) is deactivated, thereby isolating the data cell 102 from the bitline pair. The data bit is therefore maintained in the capacitor 106. The CMOS cross-coupled SA 130 is thereafter deactivated, and equalizer devices 120 equalize the BLs so that they are once again precharged at the ½ $V_{DD}$ level.

The timing diagram in FIG. 1 illustrates an example of a conventional "1" bit read and then a "0" bit write operation. During the signal development step (A), the voltage on WL goes from low to high. Initially, bitline pairs BL and BL bar are both at 1.5 volts from a previous precharging (for illustrative purposes, it will be assumed that $V_{DD}$=3 volts). Once WL goes high, the gate of FET 104 is turned on, thereby coupling capacitor 106 (with its stored 3 volt/"1" bit charge) to BL. The voltage on BL begins to increase from 1.5 volts while the voltage on BL bar remains at 1.5 volts. When the sense amplifier SA 130 connected to BL and BL bar is enabled during step (B), a differential voltage across BL and BL bar is sensed and thereafter amplified. Thus, BL is driven up to 3 volts, while BL bar is driven down to 0 volts. This then enables a writeback of data to cell 102. Without SA 130, the data in cell 102 would be lost upon coupling capacitor 106 to BL.

Because a "0" bit write is called for in this example, the values of BL and BL bar are "flipped" during step (C) such that BL is driven to 0 volts and BL bar is driven to 3 volts by driving DL to a low level while keeping DL bar high. Thus, the capacitor 106 will then be pulled to 0 volts, still being coupled to BL as WL is still high. Finally, in step (D), WL is deactivated, a "0" bit is written to cell 102, and BL and BL bar are once again precharged to 1.5 volts.

Figure 2A:
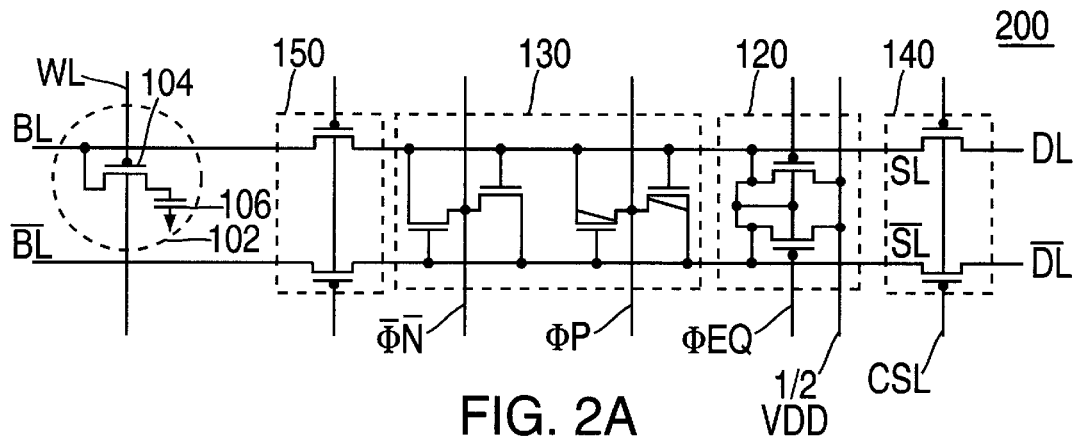
FIG. 2 is a schematic and associated timing diagram of an exemplary DRAM structure having a destructive read/delayed write feature, in accordance with an embodiment of the invention.
Figure 2B:
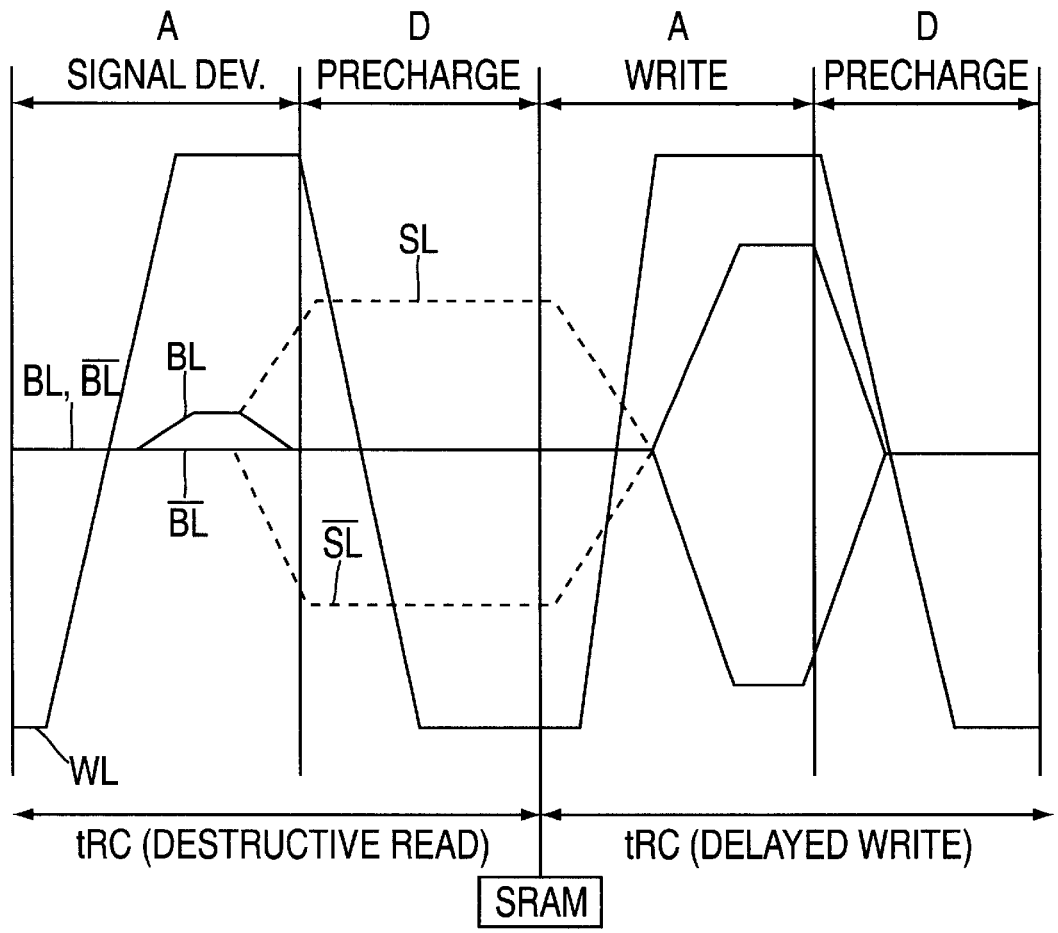

The existing architecture 100, thus configured, makes it difficult to improve the overall random access cycle time (tRC) due to the sequential execution of all the operations (A), (B), (C), and (D) discussed above. Therefore, in accordance with one embodiment of the present invention, there is shown in FIG. 2 a DRAM array 200, and an associated timing diagram illustrating the operation thereof, featuring a "destructive read" architecture. For purposes of illustration only, similar or like components described hereinafter have the same reference numeral designations as previously described components.

In addition to the previously described elements, array 200 further includes switching devices 150 connected between bitlines (BL) and sense lines (SL). Again, when the WL goes high, the capacitor 106 is coupled to the corresponding bitline (BL) through FET 104. Prior to the WL activation, the BL equalizing devices 120 are turned off ($\Phi_{EQ}$=low), and making it possible to change the BL voltage by transferring the charge from the storage capacitor 106. Switching devices 150 are then temporarily turned on to transfer the signal developed on the BL pair over to the SL pair. The switching devices 150 are then turned off and SLs are decoupled from the BLs before the precharge operation is executed thereon. This allows the WL, the BL and BL bar to be precharged immediately and simultaneously after a sensing signal has been developed on the BLs and SLs.

Accordingly, the sense amplifier SA 130 amplifies the differential voltage between SL and SL bar in a "pipeline" manner. Unlike the conventional architecture shown in FIG. 1, the SA 130 is used only for transferring a data bit to the data line (DL). Due to the isolation of the BLs from the DLs, the signal on the capacitor 106 of cell 102 is destroyed after the signal has been read (thus, comprising a destructive read architecture). The data bit transferred to the DLs is then copied to a static random access memory (SRAM). During a write mode, the data bits are directly written to the corresponding DRAM cell as a "write though". Alternatively, the written bit may be read and stored in the SRAM for a future delayed write back, similar to the read mode. Some of the read bits may be overwritten with the input data bits and stored in the SRAM for future delayed write back. Such an option would allow a chip to support a bit or byte mask mode.

Regardless of the write-through and delayed write options implemented, all of the data bits accessed by a wordline (WL) are simultaneously written back to the corresponding DRAM cells. The write mode may commence prior to signal development, thereby avoiding the tRC penalty normally incurred during a write mode. A destructive read architecture, therefore, eliminates the time components of the overall tRC represented by the operational steps of (B) bitline sensing and (C) signal write back, regardless of whether the system is in a read or write mode. As a result, the overall speed improvement of the random access cycle time (tRC), using the architecture shown in FIG. 2, is as much twice that of the conventional DRAM architecture.

The timing diagram in FIG. 2 further illustrates the elimination of steps (B) and (C). Once WL is enabled and a bitline signal differential is developed, the bitlines are immediately precharged and returned to 1.5 volts. The amplification used to rewrite or flip the data bit occurs on the isolated SL and SL bar lines, which bit is then stored in SRAM for future use. Thus, the cycle is completed after steps (A) and (D), since the data read (and destroyed from the cell) is temporarily saved into SRAM and rewritten back into the cell at a later time if need be.

Figure 3:
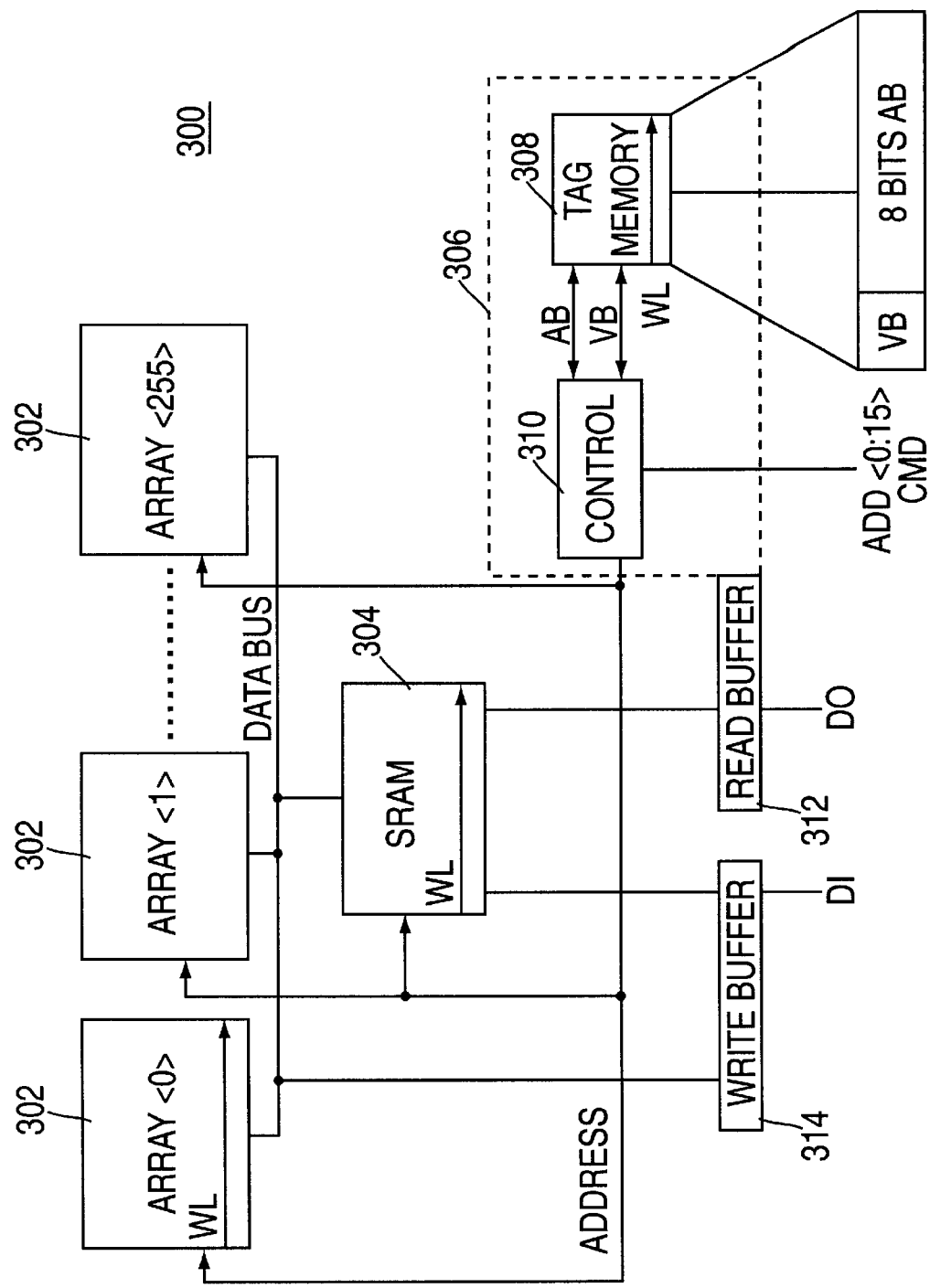
FIG. 3 is block diagram of a DRAM control architecture using a destructive read/delayed write feature, in accordance with an embodiment of the invention.

Referring now to FIG. 3, an architecture 300, in accordance with an embodiment of the invention, is shown. Architecture 300 includes a plurality of DRAM arrays 302 (individually designated by Array <0> through Array <255>), and at least one SRAM 304 array within a given chip. While the size of each DRAM array 302 may be different, the total number of data bits for the SRAM array 304 should be larger than the largest individual DRAM array size. Optionally, a plurality of DRAM arrays 302 may be grouped as a bank. In this case, the density of the SRAM array should be equal to or larger than the DRAM bank size containing a plurality of DRAM arrays. For purposes of illustration only, the following description assumes a total of 256 DRAM arrays, each consisting of 32K cells. The 32K cells are each accessed by 256 wordlines (WLs) and 128 bitline (BL) pairs. The SRAM array 304 is organized similar to each DRAM array 302 (having 32 K cells accessed by 256 WLs and 128 BL pairs).

As discussed previously, a DRAM read command reads out all data bits (128*b*) sensed in a 32K DRAM array 302 to the SRAM array 304. A scheduler 306 controls and keeps track of the DRAM arrays 302 and the SRAM array 304 so that the data bits stored in the SRAM array 304 will be correctly written back to the corresponding DRAM array 302 as a delayed write back. Scheduler 306 receives a command signal (CMD) along with a 16-bit address vector (designated by ADD <0:15>) from a controlling entity such as a CPU (not shown). Bits 8 through 15 of the address vector (ADD <8:15>) are used for decoding a selected array, representing one of the 256 DRAM arrays 302. Bits 0 through 7 of the address vector (designated by ADD <0:7>) are used for decoding an individual WL within the selected DRAM array 302. The command signal (CMD) is a signal corresponding to either a read or a write mode.

In one embodiment of the architecture 300 shown in FIG. 3, a direct mapping scheduling method for scheduling DRAM and SRAM access is contemplated. In a direct mapping scheduling method, a write back operation from the SRAM to a corresponding DRAM array is enabled only when new data to be copied to the SRAM from a different DRAM array comes from the same wordline. For example, if a read operation were to be executed for the data in wordline 0 of array <1>, but the SRAM already had data stored for wordline 0 from any one of the other arrays, then that previously stored data in wordline 0 would have to be written back to whichever array it came from before the SRAM could then store the new data contained in wordline 0 of array <1>.

For exemplary purposes only, scheduler 306 further supports 128 data inputs and outputs (corresponding to the maximum number bits obtained from a DRAM array 302) without a byte or bit masking function. When the scheduler 306 supports a smaller number of bits (e.g., 64), byte or bit masks, a different scheduling method is used. A data input pin (DI) and a data output pin (DO) are preferably not shared, although it will be appreciated the present embodiments are not limited in this manner.

The scheduler 306 further includes a TAG memory 308, which comprises 256 wordlines (WL), similar to the DRAM 302 and SRAM 304 arrays. The individual TAG memory 308 cells are accessed through ADD <0:7> in order to activate the corresponding WL. In turn, the TAG memory 308 cells activated by the corresponding WL store 8 array address bits (AB), identifying one out of 256 DRAM arrays, as well as a valid bit (VB) verifying the availability of the SRAM. More specifically, if the VB in a TAG memory is "1", the SRAM 304 contains the data bits for the corresponding DRAM array as identified by the bits AB.

A 3-phase pipeline stage scheme, preferably including: (1) TAG access and DATA input, (2) DRAM access, and (3) Data Output is used for the direct mapping scheduling method. Other pipeline schemes, however, are contemplated.

The operation of the DRAM architecture 300, using the direct mapping scheduling method will be understood with the following description. It is first assumed, initially, that a read mode is detected by a predetermined read command (CMD). Once a read mode is detected, the following pipeline scheme is enabled:

Phase I: The SRAM 304 immediately starts to check the data bits from the particular WL therein, as identified by the address vector ADD <0:7>. More particularly, the corresponding WL in the TAG memory 308 is accessed, also according to the input address vector (ADD <0:7>). The valid bit (VB) and the address bits AB are simultaneously read out from the TAG memory 308. The TAG memory 308 updates the bits AB (by setting AB=ADD <8:15>) and VB (by setting VB=1) for future access. A controller 310 located within the scheduler 306 checks the state of the valid bit (VB).

Phase II: If VB=0, then the SRAM 304 does not contain any data bits therein (Read MISS/NO Write Back). This enables a DRAM array read access mode. The controller 310 then activates the corresponding DRAM array read operation through ADD <0:15>, followed by an SRAM array write operation through ADD <0:7>. All data bits coupled to the activated WL in the addressed DRAM array are therefore copied to the SRAM 304 during this second pipeline phase. The data bits are also copied to a read buffer 312. If VB=1, then the SRAM 304 contains data bits from a previously accessed DRAM array 302. The controller 310 detects whether or not the address bits AB are same as in ADD <8:15>. It should be noted that this detection is done in the first pipeline phase. If the address bits are matched (Read HIT), the controller 310 will not enable a DRAM array read operation in this second pipeline phase. The data bits read from the SRAM 304 in the first pipeline stage are then copied to the read buffer 312.

However, if the address bits are not matched (Read MISS/Write Back), the controller 310 enables a DRAM read access mode for the corresponding DRAM array 302 identified with the address vector ADD <0:15>. The data bits from the corresponding DRAM array 302 are copied to the SRAM 304 and the read buffer 312. Simultaneously, the controller 310 enables a DRAM write back from the SRAM 304 to the corresponding DRAM array 302 identified by the address bits AB. The data bits read from the SRAM 304 in the first pipeline stage are then written back to the corresponding DRAM array 302 identified by the address bits AB and the address vector ADD <0:7>. A dual port SRAM is preferably used for this simultaneous read and write operation.

Phase III: Data bits are read out from the read buffer 312 to the data output pins (DO).

It is now assumed that a write mode is detected by a predetermined write command. When a write mode is detected, another pipeline scheme is enabled:

Phase I: The write data bits on the data input pins (DI) are placed in a write buffer 314. Simultaneously, the corresponding WL in the TAG memory 308 is accessed according to the input address vector (ADD <0:7>). The TAG memory 308 updates the address bits AB (by setting AB=ADD<7:15>) and VB (by setting VB=1) for future access. Beforehand, the controller 310 checks the state of valid bit (VB). Phase II: If VB=0, the SRAM 304 does not contain any data bits therein (Write MISS/no Write Back). The controller 310 therefore allows the SRAM 304 to store the data bits placed in write buffer 314 during the first pipeline phase. If VB=1, the SRAM 304 contains some data bits. The controller 310 detects whether or not the bits in AB are the same as the bits in ADD <7:15>. Similar to the read mode, the write mode detection is also done in the first pipeline stage. If the address bits are matched (Write HIT), the corresponding data bits in the SRAM 304 are overwritten.

However, if the address bits are not matched (Write MISS/Write Back), the data bits in the write buffer 314 are written to the SRAM 304, while transferring the previously stored data bits back to the corresponding DRAM array 302 (referred to hereinafter as Delayed Write Back). The TAG memory 308 should be updated for storing new data in the SRAM 304. Alternatively, without writing to the SRAM 304 and without updating the TAG memory 308, the data bits in the write buffer 314 may be directly written back to the DRAM core as a write through (referred to hereinafter as Write Through). VB in the TAG memory should then be overwritten to 0 if the SRAM contains the old data bits for the corresponding DRAM core prior to the write through. However, if the SRAM contains the data bits for another DRAM core not related to the write through, then the data bits and the valid bit VB should be kept as they are.

Phase III: No Operation

Figure 4:
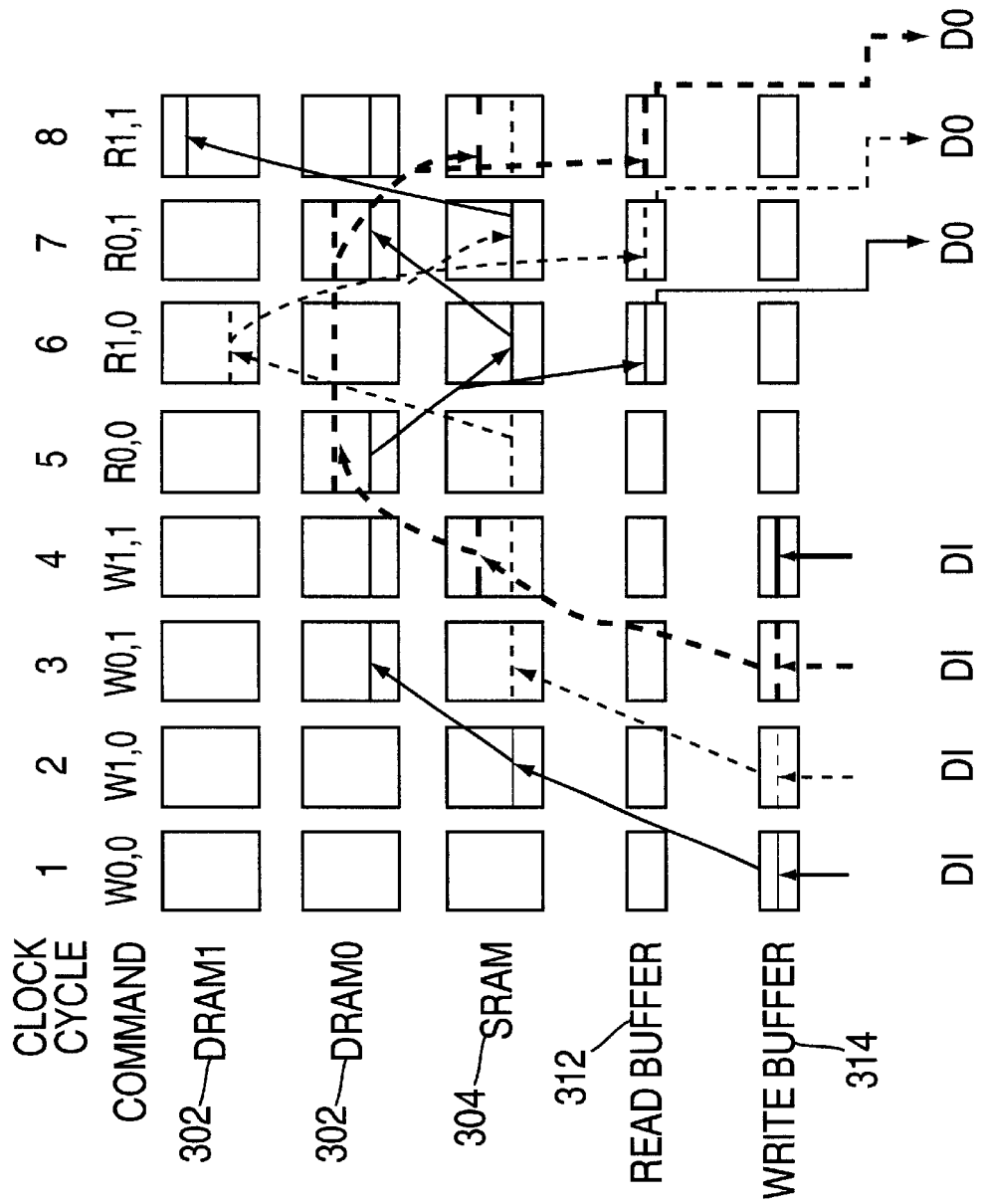
FIG. 4 is a data flow diagram illustrating an example of one embodiment a method for controlling the operation of the DRAM system in FIG. 3.

FIG. 4 is a data flow diagram illustrating an example of the DRAM and SRAM array operation using the direct mapping scheduling method described above. By way of example, only two of the DRAM arrays 302 (array <0> and array <1>) are used to illustrate the following commands received during eight sequential clock cycles:

1. write to DRAM array 0, wordline 0 (W 0, 0);
2. write to DRAM array 1, wordline 0 (W 1, 0);
3. write to DRAM array 0 wordline 1 (W 0, 1);
4. write to DRAM array 1 wordline 1 (W 1, 1);
5. read from DRAM array 0, wordline 0 (R 0, 0);
6. read from DRAM array 1, wordline 0 (R 1, 0);
7. read from DRAM array 0, wordline 1 (R 0, 1); and
8. read from DRAM array 1, wordline 1 (R 1, 1).

In the illustrated example, the preferred embodiment "Delayed Write Back" embodiment is used for the write mode.

During the first clock cycle, a command to write data into DRAM array 0 at wordline 0 is received. The data for (W 0, 0) transmitted on input pins DI is initially stored in the write buffer 314, as indicated by the thin solid arrow. It will be initially assumed that the SRAM 304 previously contained no data bits, and therefore the (W 0, 0) data may be stored in the SRAM 304 during the next pipeline phase (clock cycle). At the second clock cycle, write command is received for DRAM array 1, wordline 0. The (W 0, 0) data is shifted from the write buffer 314 and written into SRAM 304. At the same time, the (W 1, 0) data is stored in write buffer 314, as indicated by the thin dashed arrow.

During the third clock cycle, a write command is received for DRAM array 0, wordline 1. Again, the (W 0, 1) data is moved into write buffer 314, as indicated by the thick dotted arrow. However, since wordline 0 in the SRAM 304 already contains data therein (from (W 0, 0)), the SRAM must immediately write the (W 0, 0) data into the corresponding DRAM array so that it can store the (W 1, 0) data previously inputted into the write buffer 314 during the second clock cycle. Thus, at the end of the third clock cycle, DRAM array 0 contains the (W 0, 0) data, SRAM 304 contains the (W 1, 0) data, and write buffer 314 contains the (W 0, 1) data.

During the fourth clock cycle, a write command is received for DRAM array 1, wordline 1. Once again, this data is first stored into write buffer 314, as indicated by the thick solid arrow. However, it will be noted this time that since wordline 1 in SRAM 304 is clear, no immediate write back into DRAM takes place in this clock cycle. Instead, the (W 0, 1) data is now stored in SRAM 304, as well as the (W 1, 0) data stored during the third clock cycle.

Referring now to the fifth clock cycle, a read command is received for DRAM array 0, wordline 0. (It will be recalled that the (W 0, 0) data, inputted initially at the first clock cycle, was written into DRAM array 0 during the third clock cycle). Continuing along with the above described pipeline scheme, then, the (W 0, 1) data in SRAM 304 is written in DRAM array 0, wordline 1. This is because wordline 1 in SRAM 304 is now needed to store the (W 1, 1) data taken from the write buffer 312.

During the sixth clock cycle, a read command is now received for DRAM array 1, wordline 0. Because wordline 0 in SRAM is needed to store the (R 0, 0) data requested during the previous clock cycle, the (W 1, 0) data which has just been requested is finally written into DRAM array 1, wordline 0. Then, the data contained in DRAM array 0, wordline 0 is read therefrom and stored in both SRAM 304 and read buffer 312. Again, due to the destructive read architecture, the SRAM also stores the (W 0, 0) data because, at some point, it must be re-written back to DRAM array 0, wordline 0.

Referring now to the seventh clock cycle, a read command is received for DRAM array 0, wordline 1. Recalling that the previous read command was for the data in DRAM array 1, wordline 0, the SRAM wordline 0 is now needed. Thus, the (W 0, 0) data is immediately re-written back to DRAM array 0, wordline 0 to make room. At the same time, the data in DRAM array 1, wordline 0 is read therefrom into both SRAM 304 and the read buffer 312. The data read from DRAM array 0, wordline 0, which has just been written back thereto, but also previously stored in read buffer 312, is sent out through data output pins DO.

Finally, during the eighth clock cycle, a read command is received for DRAM array 1, wordline 1. Since wordline 1 of SRAM is needed to hold the data from the previous (R 0, 1) command, the (W 1, 1) data which has just been requested is finally written into DRAM array 1, wordline 1. Then, the data requested from DRAM array 0, wordline 1 is read into SRAM 304 and read buffer 312, while the previously stored data in read buffer 312 is outputted through data output pins DO.

From the foregoing, it will be seen that a total write back operation in a destructive read is realized using a direct map scheduling. Furthermore, because the SRAM array size is equal or larger than the largest DRAM array size, no SRAM overflowing occurs, even if the same array is continuously accessed. Once again, the data input pin (DI) and data output pin (DO) are preferably not shared in this example; however, other configurations are contemplated.

Figure 5:
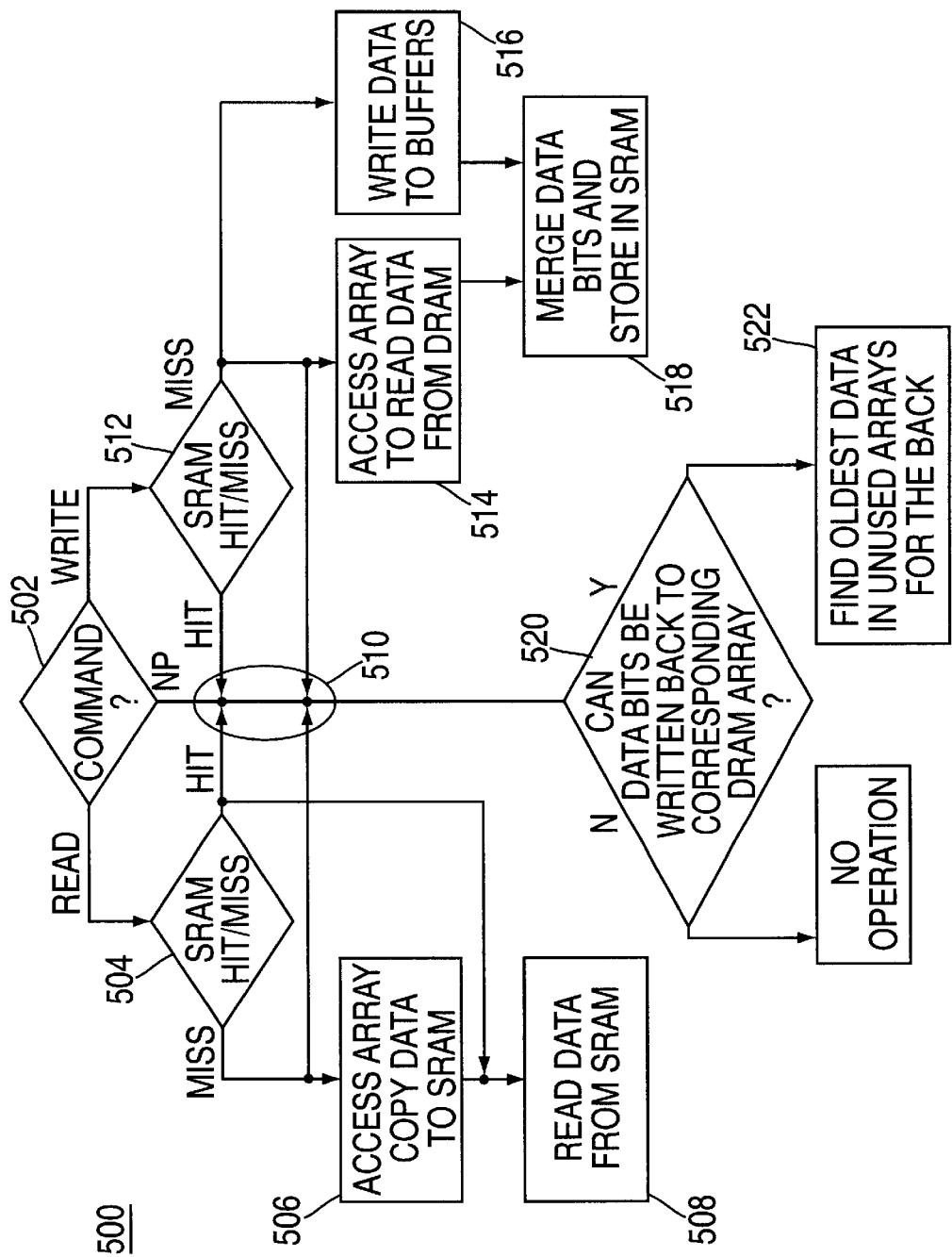
FIG. 5 is a flowchart illustrating an alternative embodiment of the method illustrated in FIG. 4.

Referring now to FIG. 5, an embodiment of an alternative scheduling method 500 is illustrated by the flowchart therein. Method 500 begins with decision block 502 and determines whether a read command is detected, a write command is detected or no command is detected. If, for example, a read command is detected, method 500 proceeds to decision block 504 where it is then determined whether there is a "hit" or a "miss" in the SRAM. A "hit" means that the data to be read out is already contained within one of the SRAM addresses, while a "miss" means that the data is not in the SRAM. In the event of a "miss", the data to be read out is accessed from the corresponding DRAM array and copied into the lowest available SRAM address at block 506. Then, at block 508, the data from SRAM is read. On the other hand, in the event of a "hit", the data is already in SRAM and method 500 goes directly to block 508.

If at decision block 502, a write command is detected, then method 500 proceeds to decision block 512. Here, it is again determined whether there is an SRAM "hit" or "miss". After a "miss", (and in addition to proceeding to write back node 510) method proceeds to both blocks 514 and 516. At block 514, any data bits present are read from the corresponding DRAM. At the same time, the new data to be written is sent to the write buffer at block 516. Then the read data from the DRAM and the written data from the write buffer are merged and stored in the lowest available SRAM address at block 518. It will be noted that the merged data is not immediately written to the corresponding DRAM array, but instead is stored in the SRAM 518.

Regardless of whether a read, write or no command (NP) is detected, method 500 eventually proceeds to write back node 510, where a write back determination is made at decision block 520. The write back determination at decision block 520 determines whether there is any data in the SRAM at all (to be written back to the DRAM available for write-back). If there is no data which can be written back to a corresponding DRAM, then there is no further operation at that point. On the other hand, if there are data bits available for write-back, the oldest data stored therein (whether from a read operation or a write operation) is written back/written into the proper DRAM array at block 522.

Figure 6A:
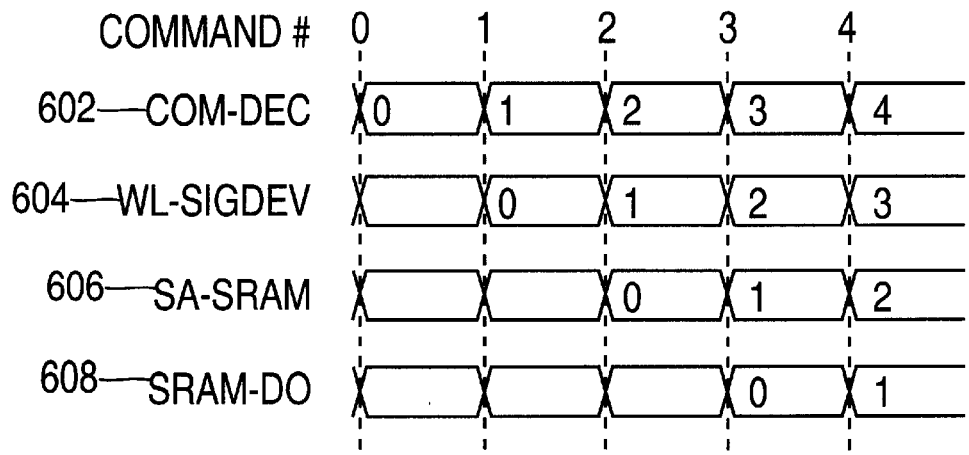
FIGS. 6A–6C are command pipeline diagrams for the embodiment of FIG. 5.
Figure 6B:
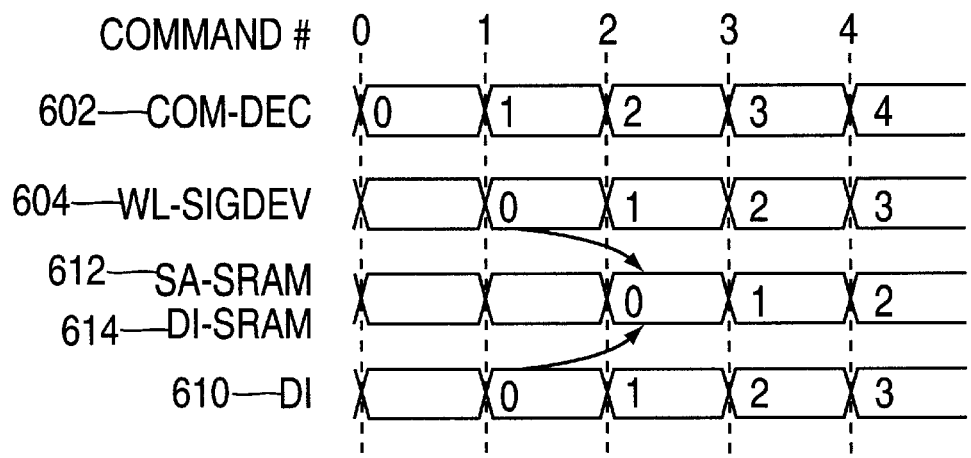
Figure 6C:
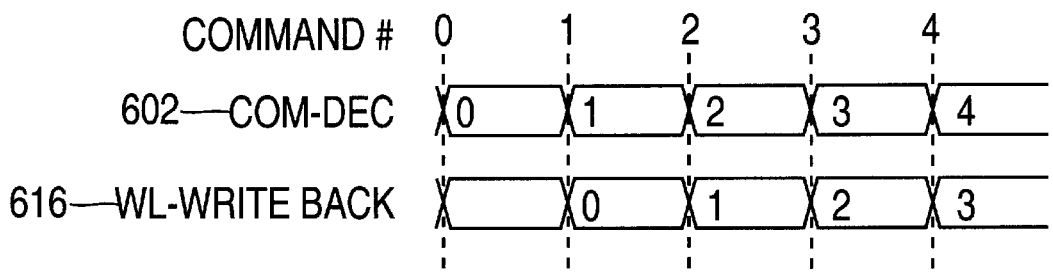

FIGS. 6(a)–(c) illustrate a preferred pipeline diagram for the embodiment of the method described in FIG. 5. As shown in FIG. 6(a), the DRAM array read access operation is divided into four pipeline stages: command detection and address decoding (COM-DEC) 602 for the address vector ADD <0:15>; WL activation and signal development (WL-SIGDEV) 604; SA activation and SRAM data copy (SA-SRAM) 606, for sensing and transferring the data bits to the SRAM and the data read buffer; and a DQ read from SRAM (SRAM-DO) 608. A series of commands (numbered 0 through 4) are shown as they progress through the pipelines at each successive clock pulse (indicated by the vertical dashed lines).

In contrast to the embodiment of the direct mapping method discussed hereinbefore, the SRAM array 304 stores data bits in the lowest address data cells which do not contain any previously stored data bits. It should be noted that a DRAM array starts a BL and WL precharging operation at the third pipeline stage. In the fourth pipeline stage, the data bits are sent from the read data buffer to the data output pin, thereby resulting in a read latency of 4 (clock cycles).

In FIG. 6(b), a DRAM array write mode further includes a data input pipeline stage from data input pin (DI) with a write latency of 1 from the initial command detection thereof. Again, the first pipeline stage of the DRAM array write mode is the command detection and address decoding (COM-DEC) 602, as is the case with the DRAM array read access mode in FIG. 6(a). The second pipeline stage is WL activation and signal development (WL-SIGDEV) 604, which is also similar to the DRAM array read access mode. The second pipeline stage, however, includes a data input stage (DI) 610 from the data input pin to the write buffer, having a write latency of 1. Optionally, data bits may be fetched to the write buffer at the first pipeline stage, and may be digitally delayed to support a write latency of 0. In a third pipeline stage, the data bits are transferred from the sense amplifier to SRAM (SA-SRAM) 612; however, some data bits are overwritten by the data bits fetched in data write buffer (DI-SRAM) 614. For example, assuming that the DRAM array transfers 128 bits while having 64 data input pins, then 64 out of 128 bits are overwritten. Optionally, the overwrite function for some bits (e.g., 8 out of 64 bits) may be prohibited by utilizing a byte or bit mask command. These data bit handlings are enabled prior to the SRAM write mode. The SRAM therefore stores the data bits that have been handled for data inputs and/or byte or bit mask function. Similar to the DRAM array read access mode, the SRAM array stores data bits in the lowest address data cells which do not contain previously stored data bits for the write back.

Referring now to FIG. 6(c), a delayed write-back pipeline may be enabled when the corresponding DRAM array is available for writing back previously stored data bits in the SRAM. The first pipeline stage is a command and address decoding stage (COM-DEC) 602, which is again similar the other two pipelines. During this first pipeline stage, the scheduler determines whether or not the corresponding DRAM array is available for the second pipeline stage. It should be noted that, at most, only one DRAM array is unavailable at a given time for the DRAM data read at the second pipeline stage. If no command is given, then all the DRAM arrays are available for the DRAM write back. The scheduler first determines the data bits in the lowest address data cells which contain previously stored data bits for the write back. The scheduler then detects whether or not the DRAM array is available for the write back in the second pipeline stage. If it detects that the DRAM array is not available, the scheduler then chooses the next lowest address data cells which contain previously stored data bits a the write back operation. These detections and scheduling are done in the first pipeline stage. An actual write back operation (WL-Write Back) 616 will be enabled in the second pipeline stage according to this scheduling.

Figure 7:
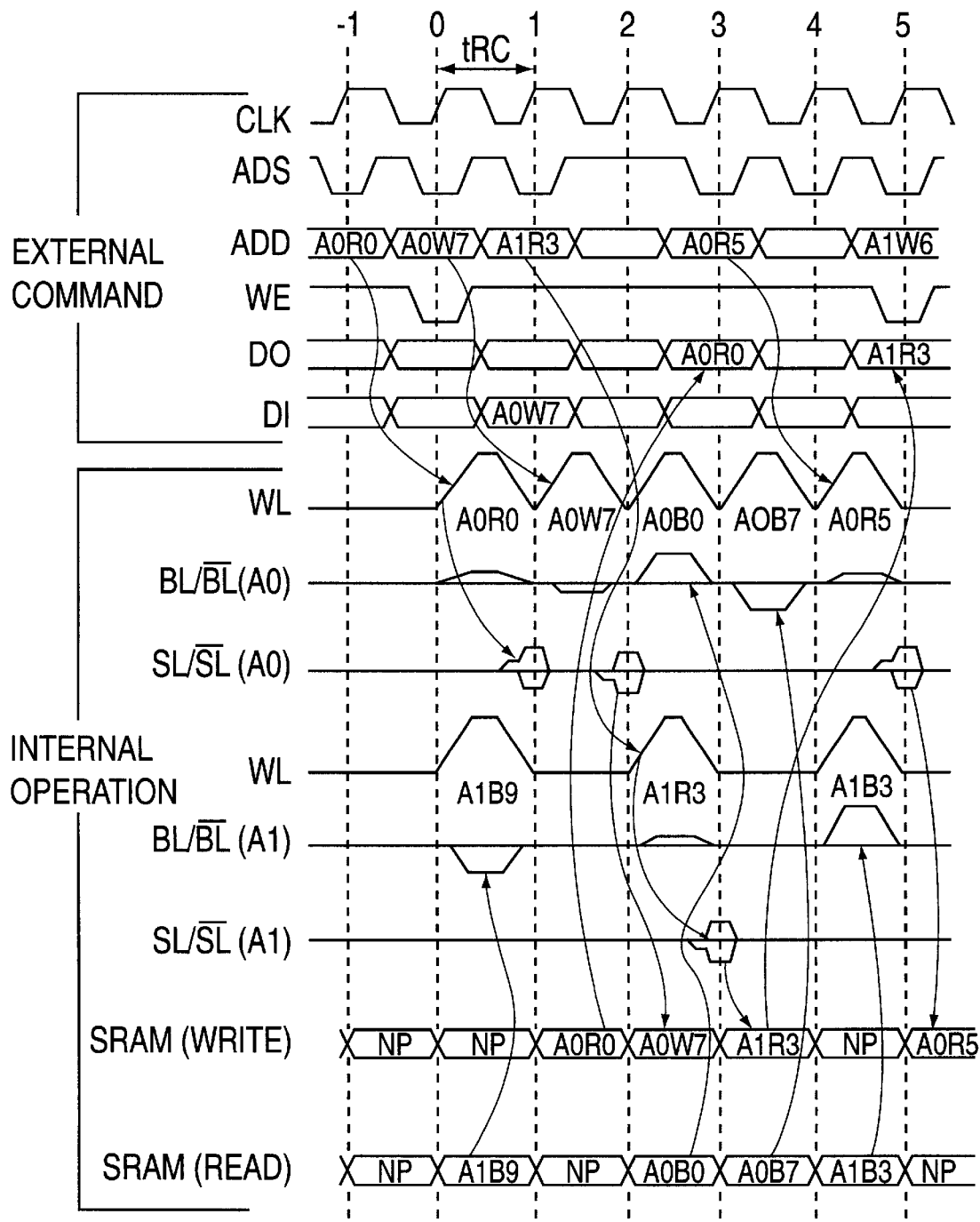
FIG. 7 is a timing diagram comparing internal and external operations for the method in FIG. 5.

FIG. 7 is a timing diagram comparing internal and external operations for the to method in FIG. 5, in view of the pipeline schemes shown in FIG. 6. In FIG. 7, the "xyz" in the "Axyz" designations represent: the DRAM array (0 or 1), the command (R=read, W=write: B=Write Back), and the address. For example, the designation A0R0 means that a read mode command is detected for address 0 in the array 0, while the designation A0W7 means that a write mode command is detected for address 7 in the array 0. Further, the designation A1B9 means that a write back mode is detected for address 9 in the array 1.

The DRAM commands are detected by the address strobe (ADS) and write enable (WE), synchronized with a clock (CLK), and the array status. More specifically, if the ADS is high, a no operation command (NP) is detected. If the ADS is low, the DRAM accepts the address (ADD) shown in the pipeline. If the WE is high, the read mode is enabled, and the data bits are outputted to the data output pin (DO) with a read latency of 4. If the WE is low, the write mode is enabled, and the data bits from the data input pin (DI) with a write latency of 1. However, as discussed in the previous scheduling embodiment, a write mode latency of 0 could be used by adding an additional data input pipeline stage.

A write back operation in the corresponding array is scheduled when one of the following conditions is detected: (1) NP, (2) SRAM HIT, or (3) activation of other arrays. For example, the A0R0 command detected at clock cycle-1 triggers a write back operation for array 1 (A1B9). The A1R3 command detected at clock cycle 1 triggers the write back operation for array 0 (A0B0). The NP command detected at clock cycle 2 also triggers a write back operation for array 0 (A0B7). Then, the A0R5 command detected at clock cycle 3 triggers the write back operation for the array 1 (A1B3).

Figure 8:
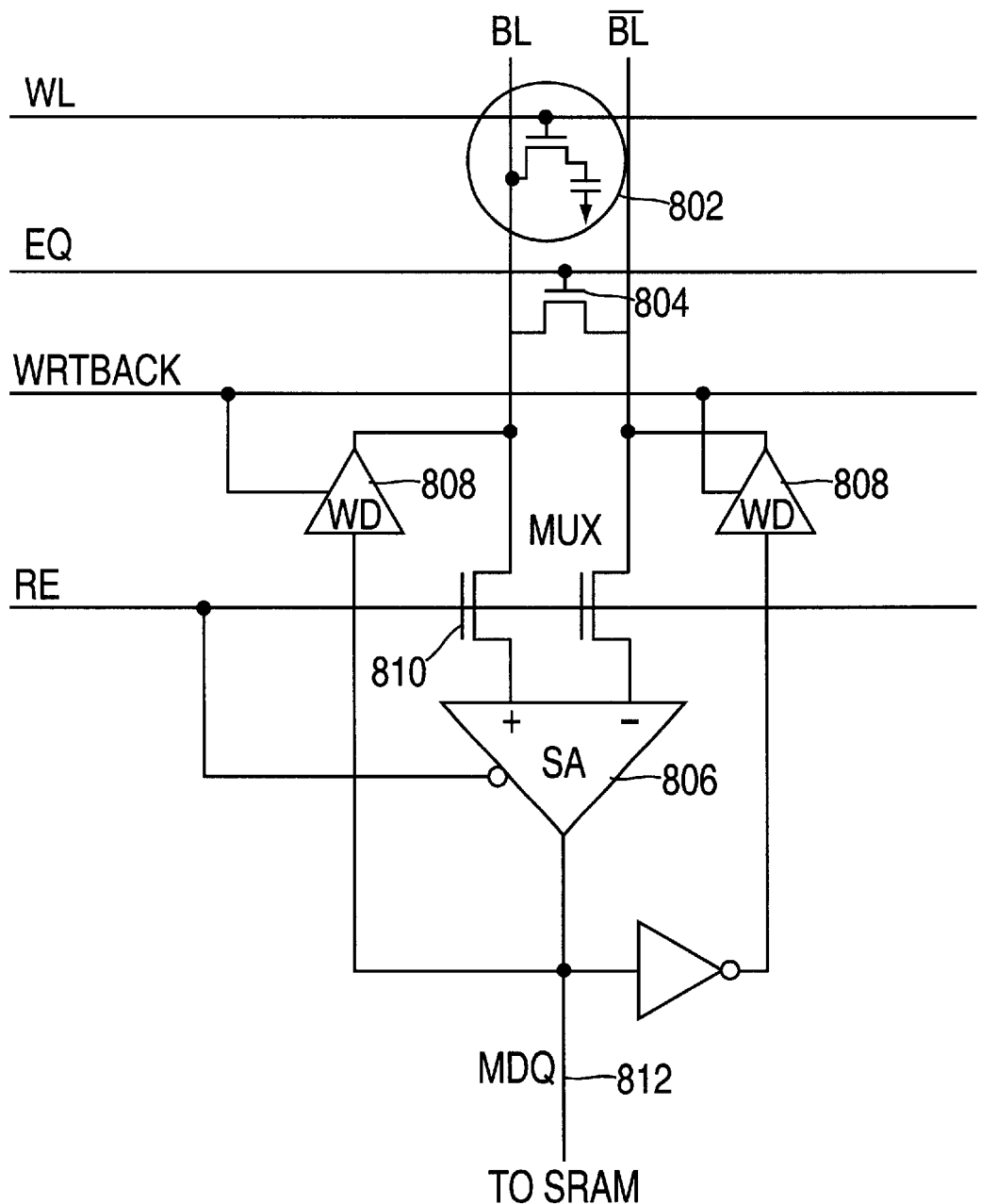
FIG. 8 is a schematic of a exemplary DRAM cell structure embodying the method illustrated in FIGS. 5–7.

Finally, FIG. 8 illustrates a schematic of a exemplary DRAM cell structure 800 embodying the method illustrated in FIGS. 5–7. The structure 800 includes a cell 802, a BL equalizer (EQ) 804, a sense amplifier (SA) 806, and write drivers (WD) 808. NMOS multiplexers (MUX) 810 are also used for coupling between a BL pair to an SL pair for the destructive read pipeline operation. When a read or write mode is detected, the wordline (WL) goes high. This, again, results in the development of a signal on the BL pair. The WL is then deactivated, and equalizer (EQ) turns on simultaneously and immediately after the signal has been developed on the BL pair to recharge the bitlines. In this signal development phase, a pulsed signal RE periodically turns on the MUXs, coupling the BL pair to the SL pair. The signal transfer between BL pair to SL pair is fast, as the SL capacitance is very small. When the pulsed signal RE goes low, the SA 806 starts the SL sensing. A direct sensing scheme is preferably used; however, other sensing schemes are contemplated. (Additional information on sensing schemes may be found in "A 17 ns, 4 Mb CMOS DRAM", Takeshi Nagai, et. al., IEEE Journal of Solid-State Circuits, Vol. 26, No. 11, pp. 1538–1543, November 1991, incorporated herein by reference.)

The sensing results are transferred to SRAM through a hierarchical data line (MDQ) 812, preferably arranged over the DRAM arrays. (Additional information on hierarchical data lines may be found in "Fault-Tolerant Designs for 256 Mb DRAM", Toshiaki Kirihata, et. al., IEEE Journal of Solid-State Circuits, Vol. 31, No. 4, pp. 558–566, April 1996, incorporated herein by reference.) For a signal write back operation, the WL goes high. Simultaneously, the signal write back (WRTBACK) goes high, forcing the BL and BL bar go high and low, respectively, (or low and high) depending on the MDQ data pattern. Because all the BLs in a page are forced by the write drivers 808 avoiding a data bit destruction due to the BL-BL bar coupling effect, there is no late write penalty. The BL swing is halved from the conventional write full BL voltage swing, further improving the write back speed. The WL is deactivated, and equalizer (EQ) turns on immediately after the signal has been written back to the cell. The embodiment of FIG. 8 assumes a single data rate synchronous DQ interface, but the invention is not limited in this configuration. The protocol may also include a double data rate protocol for the interface, or may include a burst read and write operation.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for controlling the operation of a dynamic random access memory (DRAM) system, the DRAM system having a plurality of memory cells organized into rows end columns, the method comprising:

enabling a destructive read mode, said destructive read mode for destructively reading a bit of information stored within an addressed DRAM memory cell;

temporarily storing said destructively read bit of information into a temporary storage device;

enabling a delayed write back mode, said delayed write back mode for restoring said bit of information back to said addressed DRAM memory cell at a later time; and scheduling the execution of said delayed write back mode, said scheduling dependent upon the availability of space within said temporary storage device.

2. The method of claim 1, wherein said enabling a destructive read mode further comprises:

developing a differential signal on a pair of precharged complementary bit lines, one of said bit lines being coupled to said addressed DRAM memory cell;

transferring said differential signal from said pair of bit lines to a pair of sense lines and isolating said sense lines from said bit lines immediately thereafter; and precharging said pair of bit lines.

3. The method of claim 2, wherein said differential signal on said pair of bit lines is developed when a wordline, coupled to said individual memory cell, is activated.

4. The method of claim 1, wherein said temporary storage device comprises a static random access memory (SRAM).

5. The method of claim 4, wherein said SRAM temporarily stores information to be written into said addressed DRAM memory cell.

6. The method of claim 5, wherein said SRAM temporarily stores information in an SRAM address that corresponds to the address of said addressed DRAM memory cell.

7. The method of claim 1, wherein a random access cycle time for the DRAM system does not include said enabling said delayed write back mode.

8. The method of claim 7, wherein said random access cycle time for the DRAM system only includes said enabling said destructive read mode.

9. The method of claim 5, wherein a delayed write back mode is executed if said SRAM is unable to temporarily store information, in addition to the information already contained therein.

10. A method for scheduling write back operation in a destructive read DRAM architecture including a plurality of DRAM arrays, the method comprising:

receiving an operational command;

determining whether said operational command is:

a read command, said read command resulting in reading out data from an addressed DRAM array referenced therewith; or a write command said write command resulting in writing data to an addressed DRAM array referenced therewith;

regardless of which said operational command is received, determining whether a write back operation is to be executed, said write back operation comprising writing data temporarily stored in a specific address within an SRAM;

responding to a read command checking a specific address within the SRAM to see if there are already any data bit, contained therein, said specific address corresponding to the same address as said addressed DRAM array in which data is to be read out; and if said specific address within the SRAM does not contain any data therewithin, then no write back operation is to be executed;

if said specific address within the SRAM does contain data therewithin, then determining which DRAM array corresponds to the data contained in said specific address within the SRAM; and if the DRAM array corresponding to the data contained in said specific address within the SRAM matches the DRAM array in which data is to be read out, then no write back operation is to be executed; or if the DRAM array corresponding to the data contained in said specific address within the SRAM does not match the DRAM array in which data is to be read out, then a write back operation is to be executed.

11. The method of claim 10, wherein:

if said specific address within the SRAM does not contain any data therewithin, then the data bits within the DRAM array in which data is to be read out are copied to the SRAM and are also copied to a read buffer for outputting therefrom.

12. The method of claim 10, wherein:

if said specific address within the SRAM does contain data therewithin, and if the DRAM array corresponding to the data contained in said specific address within the SRAM matches the DRAM array in which data is to be read out then the data bits within said specific address within the SRAM are copied to a read buffer for outputting therefrom.

13. The method of claim 10, wherein:

if said specific address within the SRAM does contain data therewithin, and if the DRAM array corresponding to the data contained in said specific address within the SRAM does not match the DRAM array in which data is to be read out, then the data bits within said specific address within the SRAM are written back to the DRAM array corresponding to data contained in said specific address within the SRAM; and the data bits from the DRAM array in which data is to be read out are copied into said specific address within the SRAM, and are also copied to a read buffer for outputting therefrom.

14. A method for scheduling a write back operation in a destructive read DRAM architecture including a plurality of DRAM arrays, the method comprising:

receiving an operational command;
determining whether said operational commands is:
 a read command, said read command resulting in reading out data from an addressed DRAM array referenced therewith; or
 a write command, said write command resulting in writing data to an addressed DRAM array referenced therewith;
regardless of which said operational command is received, determining whether a write back operation is to be executed, said write back operation comprising writing data temporarily stored in a specific address within an SRAM;
responsive to a write command, checking a specific address within the SRAM to see if there are already any data bits contained therein, said specific address corresponding to the same address as said addressed DRAM array in which data is to be written in; and
if said specific address within the SRAM does not already contain any data therewithin, then no write back operation is to be executed, and data bits contained in a write buffer are stored into said specific address within the SRAM.

15. The method of claim 14, wherein:
if said specific address within the SRAM does contain data therewithin, then determining which DRAM array corresponds to the data contained in said specific address within the SRAM; and
if the DRAM array corresponding to the data contained in said specific address within the SRAM matches the DRAM array in which data is to be written in, then said data bits contained in said write buffer are written into said specific address within the SRAM; or
if the DRAM array corresponding to the data contained in said specific address within the SRAM does not match the DRAM array in which data is to be written in, then a write back operation is to be executed.

16. The method of claim 15, wherein said write back operation further comprises:
copying said data bits contained in said write buffer directly into the DRAM array in which data is to be written.

17. The method of claim 15, wherein said write back operation further comprises:
copying the data contained in said specific address within the SRAM into the DRAM array corresponding to the data contained in said specific address within the SRAM; and
copying said data bits contained in said write buffer into the SRAM.

18. A method for scheduling a write back operation in a destructive read DRAM architecture including a plurality of DRAM arrays, the method comprising:

receiving an operational command;
determining whether said operational command is:
 a read command, said read command resulting in reading out data from an addressed DRAM array referenced therewith; or
 a write command, said write command resulting in writing data to an addressed DRAM array referenced therewith; or
 a no operation commend;
regardless of which said operational command is received, executing a write back determination, said write back determination determining whether there is any temporarily stored data in an SRAM to be written back to one of the plurality of DRAM arrays; and
if there is any temporarily stored data in the SRAM to be written back to one of the plurality of DRAM arrays, then selecting the oldest data stored within the SRAM for write back.

19. The method of claim 18, further comprising:
determining, if a read command is detected, whether the data to be read is already contained in the SRAM.

20. The method of claim 19, wherein:
if the data to be read is already contained in the SRAM, then outputting the data from the SRAM; or
if the data to be read is not already contained in the SRAM then copying the data from the addressed array to the SRAM, and then outputting the data from the SRAM.

21. The method of claim 20, wherein:
said outputting the data from the SRAM is accomplished within four clock cycles from the time said read command is detected.

22. The method of claim 18, comprising:
determining, if a write command is detected, whether the data to be written is already contained in the SRAM.

23. The method of claim 22, wherein:
if the data to be written is already contained in the SRAM, then proceeding directly to said write back determination; or
if the data to be road is not already contained into SRAM then:
 reading any data stored within the addressed array;
 storing the data to be written into a write buffer;
 merging any data read from to addressed array wit to data to be written in said write buffer, thereby comprising merged data bits;
 storing the merged data bits in the SRAM; and
 proceeding to said write back determination.

24. The method of claim 23, further comprising:
implementing a mask function, said mask function capable of selectively prohibiting one or more of said merged data bits from being written into the SRAM.

25. The method of claim 23, wherein:
said storing the merged data bits in the SRAM is accomplished within two clock cycles from the time said write command is detected.

26. The method of claim 18, wherein said write back determination further comprises:
checking the availability of to DRAM array corresponding to the oldest stored data within the SRAM; and
if the DRAM array corresponding to the oldest stored data within the SRAM is unavailable, then selecting the next oldest data stored within the SRAM for write back.

27. The method of claim 26, wherein:
said write back is accomplished within one clock cycle from the time said operational command is detected.

28. A dynamic random access memory (DRAM) structure, comprising:
   an individual memory cell, said memory cell capable of storing a bit of information therein;
   a bit line, removably coupled to said memory cell, said bit line further being initially precharged prior to an operational command received in connection with said memory cell;
   a signal line, removably coupled to said bit line, said signal line receiving a signal initially generated on said bit line, wherein said bit line is no longer precharged when said signal is initially generated thereon; and
   a data line, removably coupled to said signal line;
   wherein said signal line is capable of transmitting a data bit, read from said memory cell, to said data line, simultaneously to said bitline being precharged again.

29. The DRAM structure of claim 28, further comprising:
   a sense amplifier, coupled to said signal line, said sense amplifier amplifying said signal initially generated on said bitline after said bit line is coupled to said memory cell.

30. The DRAM structure of claim 29, further comprising:
   a wordline, coupled to said memory cell, said wordline capable of coupling said memory cell to said bit line.

31. The DRAM structure of claim 29, wherein said sense amplifier amplifies said signal on said signal line after said bit line is uncoupled from said signal line.

32. The DRAM structure of claim 28, wherein:
   said data bit is destructively read from maid memory cell;
   said data bit is further temporarily stored in a temporary storage element; and
   said data bit may be written back to said memory cell after said bit line is precharged again.

33. The DRAM structure of claim 32, further comprising:
   a pair of complementary bit lines, said pair of complementary bit lines being charged to an equal voltage thereon, and one of said pair of complementary bit lines removably coupled to said memory cell;
   wherein, when said memory cell is coupled to said one of said pair of complementary bit lines, said sense amplifier amplifies a differential voltage between said pair of complementary bit lines.

34. The DRAM structure of claim 32, wherein said temporary storage element comprises a static random access memory (SRAM).

35. A dynamic random access memory (DRAM) structure, comprising:
   a plurality of individual memory cells organized into rows and columns, each column of memory cells being coupled to a corresponding word line, and each row of memory cells being removably coupled to one bit line in a pair of complementary bit lines;
   an equalizer, said equalizer precharging said pair of complementary bit lines to an equal voltage value;
   a multiplexer, said multiplexer removably coupling a selected pair of bit lines to a pair of signal lines;
   a data line, said data line capable transferring data from said selected pair of bit lines, through said pair of signal lines, to a temporary storage device; and
   a sense amplifier, said sense amplifier amplifying a signal generated on said selected pair of bit lines;
   wherein said signal generated on said selected pair of bit lines is amplified after said selected pair of bit lines are uncoupled from said pair of signal lines.

36. A dynamic random access memory (DRAM) structure, comprising:
   a plurality of individual memory cells organized into rows and columns, each column of memory cells being coupled to a corresponding word line, and each row of memory cells being removably coupled to one hit line in a pair of complimentary bit lines;
   an equalizer, said equalizer precharging said pair of complementary bit lines to an equal voltage value;
   a multiplexer, said multiplexer removably coupling a selected pair of bit lines to a pair of signal lines;
   a data line, said data line capable transferring data from said selected pair of bit lines, through said pair of signal lines, to a temporary storage device; and
   a pair of write drivers, coupled to said pair of bit lines, said write drivers enabling data read from one or more of said individual memory cell to be written back thereto.

37. A dynamic random access memory (DRAM) architecture, comprising:
   a plurality of DRAM arrays;
   a temporary memory storage device in communication with said plurality of DRAM arrays, said temporary memory storage device temporarily storing data to be read from and written to said plurality of DRAM arrays;
   a scheduler, said scheduler determining when data stored within said temporary memory storage device is to be written back to said plurality of DRAM arrays;
   a controller, said controller receiving an operational command and an address vector as an input thereto, said controller further generating a bit/byte masking function; and
   a TAG memory; and said TAG memory capable of storing said address vector;
   wherein said operational command causes said controller to enable a read or a write operation for one of said plurality of DRAM arrays.

38. A The DRAM structure of claim 37, wherein:
   said address vector references a specific DRAM array within said plurality of DRAM arrays; and
   said address vector further references a specific wordline within said specific DRAM array.

39. The DRAM structure of claim 38, wherein said temporary storage device is a static random access memory (SRAM), said SRAM containing a number of wordlines therein, which number is greater than the number of wordlines contained in the largest of said plurality of DRAM arrays.

40. The DRAM structure of claim 39, wherein:
   upon receiving said operational command and address vector, said scheduler determines whether there is any data within said SRAM, at the specific wordline in said SRAM identified within said address vector.

41. The DRAM structure of claim 40, further comprising:
   a read buffer, coupled to said SRAM; and
   a write buffer, coupled to said SRAM.

42. The DRAM structure of claim 37, wherein said TAG memory further stores a valid bit, said valid bit determining whether the SRAM contains data corresponding to said address vector.

43. The DRAM structure of claim 37, wherein said scheduler includes a direct mapping scheduling method.

44. The DRAM structure of claim 37, wherein said scheduler includes a write-through scheduling method.

* * * * *